(12) United States Patent
Srbinovski (10) Patent No.: US 10,096,440 B2
(45) Date of Patent: Oct. 9, 2018

(54) ELECTRICAL SWITCH

(71) Applicant: Judco Manufacturing, Inc., Harbor City, CA (US)

(72) Inventor: Igorce Srbinovski, Harbor City, CA (US)

(73) Assignee: JUDCO MANUFACTURING, INC., Harbor City, CA (US)

( * ) Notice: Subject to any disclaimer, the term of this patent is extended or adjusted under 35 U.S.C. 154(b) by 0 days.

(21) Appl. No.: 15/089,298

(22) Filed: Apr. 1, 2016

(65) Prior Publication Data

US 2016/0293354 A1    Oct. 6, 2016

Related U.S. Application Data

(60) Provisional application No. 62/142,638, filed on Apr. 3, 2015.

(51) Int. Cl.
*H01H 13/70* (2006.01)
*H01H 11/06* (2006.01)
*H05K 3/30* (2006.01)

(52) U.S. Cl.
CPC .......... *H01H 13/70* (2013.01); *H01H 11/06* (2013.01); *H05K 3/303* (2013.01); *H01H 2011/065* (2013.01); *H01H 2223/054* (2013.01); *H05K 2201/10053* (2013.01); *Y02P 70/613* (2015.11)

(58) Field of Classification Search
CPC .. H01H 13/70; H01H 11/06; H01H 2223/054; H01H 1/00; H01H 1/02; H01H 1/0206; H01H 1/021; H01H 1/023; H01H 2100/00; H01H 2001/021; H01H 2001/023; H01H 2201/00; H01H 2201/022; H01H 2201/024; H01H 2201/026; H05K 3/303; H05K 2201/10053; Y02P 70/613; H02H 2011/065
USPC ........... 200/520; 428/842.7, 832.2, 544, 590, 428/592, 638, 684, 685, 340
See application file for complete search history.

(56) References Cited

U.S. PATENT DOCUMENTS

| | | | |
|---|---|---|---|
| 5,083,697 A * | 1/1992 | Difrancesco | B23K 20/16 228/116 |
| 6,271,482 B1 * | 8/2001 | Crotzer | H01H 1/029 174/262 |
| 7,989,725 B2 * | 8/2011 | Boddie | H03K 17/962 200/310 |

* cited by examiner

*Primary Examiner* — Anthony R. Jimenez
(74) *Attorney, Agent, or Firm* — Brooks Acordia IP Law, PC; Michael Zarrabian (57) ABSTRACT

A keypad with a contact element in a form of a contact pill for intermittent contacting of printed circuit board (PCB) contacts on a PCB, where the contact element includes a plurality of irregularly shaped electrically conductive particles, and where the contact element is connected to the keypad or to an element of the keypad.

20 Claims, 7 Drawing Sheets

SECTION A-A
FIG. 4F

SECTION B-B
FIG. 4G

FIG. 4H SECTION C-C      SECTION D-D FIG. 4I

ELECTRICAL SWITCH

CROSS-REFERENCE TO RELATED APPLICATION

This application claims the priority benefit of U.S. Provisional Patent Application Ser. No. 62/142,638, filed Apr. 3, 2015, incorporated herein by reference in its entirety.

TECHNICAL FIELD

The present disclosure relates to electrical switches, and more particularly to contact elements for an electrical switch.

BACKGROUND

Silicon keypads are utilized over a printed circuit board (PCB) to connect contacts on the PCB. Depressing the keypad connects the contacts and closes a circuit. Removing pressure on the keypad causes it to return to its original shape and opens the circuit.

SUMMARY

An embodiment comprises an electrical switch including a keypad having a contact element in a form of a contact pill for intermittent contacting of printed circuit board (PCB) contacts on a PCB, where the contact element includes a plurality of discrete irregularly shaped electrically conductive particles, and where the contact element is connected to the keypad or to an element of the keypad.

In additional flexible keypad embodiments, the material of the plurality of irregularly shaped particles may be aluminum. In additional flexible keypad embodiments, the contact element may further include a plating. In additional flexible keypad embodiments, the material of the plating may be one or more of: silver, gold, and tin. In additional flexible keypad embodiments, the density of the plurality of irregularly shaped particles may be about 22.18 g/in³.

In additional flexible keypad embodiments, the material of the plurality of irregularly shaped particles may be silver. In additional flexible keypad embodiments, the material of the plurality of irregularly shaped particles may be one or more of: gold, brass, and copper.

In additional flexible keypad embodiments, the contact pill may be bonded to a silicon substrate. In additional flexible keypad embodiments, the material of the keypad may be silicon. In additional flexible keypad embodiments, each irregularly shaped particle of the plurality of irregularly shaped particles may have a plurality of points of contact with one or more other irregularly shaped particles of the plurality of irregularly shaped particles.

In additional flexible keypad embodiments, the plurality of points of contact may be increased during contact of the contact element across the PCB contacts via compression of the contact element. In additional flexible keypad embodiments, the contact element may be more conductive during contact of the contact element across the PCB contacts via compression of the contact element.

In additional flexible keypad embodiments, a circuit including the PCB contacts may be closed within 10 ms of contact between the contact element and the PCB contacts. In additional flexible keypad embodiments, each irregularly shaped particle of the plurality of irregularly shaped particles may be discrete. In additional flexible keypad embodiments, contact bounce between the contact element and the PCB contacts during intermittent contacting is at a minimal level.

An exemplary method embodiment may include a method for producing a contact element in a form of a contact pill including: forming a plurality of irregularly shaped particles via spraying jets of water on a falling stream of a molten first metal; bonding the plurality of irregularly shaped particles to a silicon substrate; and molding the silicon substrate onto a keypad.

Additional method embodiments may include plating the formed plurality of irregularly shaped particles with a second metal. In additional method embodiments, the first metal may be aluminum. In additional method embodiments, the second metal may be silver. In additional method embodiments, prior to molding, the bonded silicon substrate may be cut to a preferred size for the keypad, and molding the silicon substrate onto the keypad may be via heat applied to the silicon substrate and the silicon keypad.

An exemplary switch embodiment comprises: a printed circuit board (PCB) comprising a plurality of contacts; and a pushbutton disposed on the PCB, the pushbutton comprising: a substrate; and a contact element disposed on the substrate, the contact element comprising a plurality of discrete irregularly shaped electrically conductive particles; where a depression of the pushbutton causes contact of the contact element with the plurality of contacts on the PCB; and where contact of the contact element with the plurality of contacts on the PCB causes a change in orientation of one or more of the discrete irregularly shaped electrically conductive particles to create additional electrically conductive paths through the contact element between the plurality of contacts of the PCB.

BRIEF DESCRIPTION OF THE DRAWINGS

The foregoing features and other features will now be described with reference to the drawings of various aspects. In the drawings, the same components have the same reference numerals. The illustrated aspects are intended to illustrate, but not to limit the present disclosure. The drawings include the following Figures.

DETAILED DESCRIPTION

The following description is made for the purpose of illustrating the general principles of the embodiments disclosed herein and is not meant to limit the concepts disclosed herein. Further, particular features described herein can be used in combination with other described features in each of the various possible combinations and permutations. Unless otherwise specifically defined herein, all terms are to be given their broadest possible interpretation including meanings implied from the description as well as meanings understood by those skilled in the art and/or as defined in dictionaries, treatises, etc.

An embodiment disclosed herein comprises an electrical switch including a conductive contact layer (contact pill) on a pushbutton (plunger), wherein the conductive contact layer comprises irregularly shaped electrically conductive particles. In one implementation, the electrical switch comprises a silicon keypad including a pushbutton with said conductive contact layer at the base of the pushbutton.

The irregularly shaped particles of the contact pill allow for more chances for said particles to be in contact (touching) one another and form electrical conductive paths in the conductive later. As the irregularly shaped particles are compressed, additional points of contact between these particles may be created. As a result, the irregularly shaped particles of the contact pill are more conductive and cause less electrical contact bounce than existing contact pills.

Figure 1:
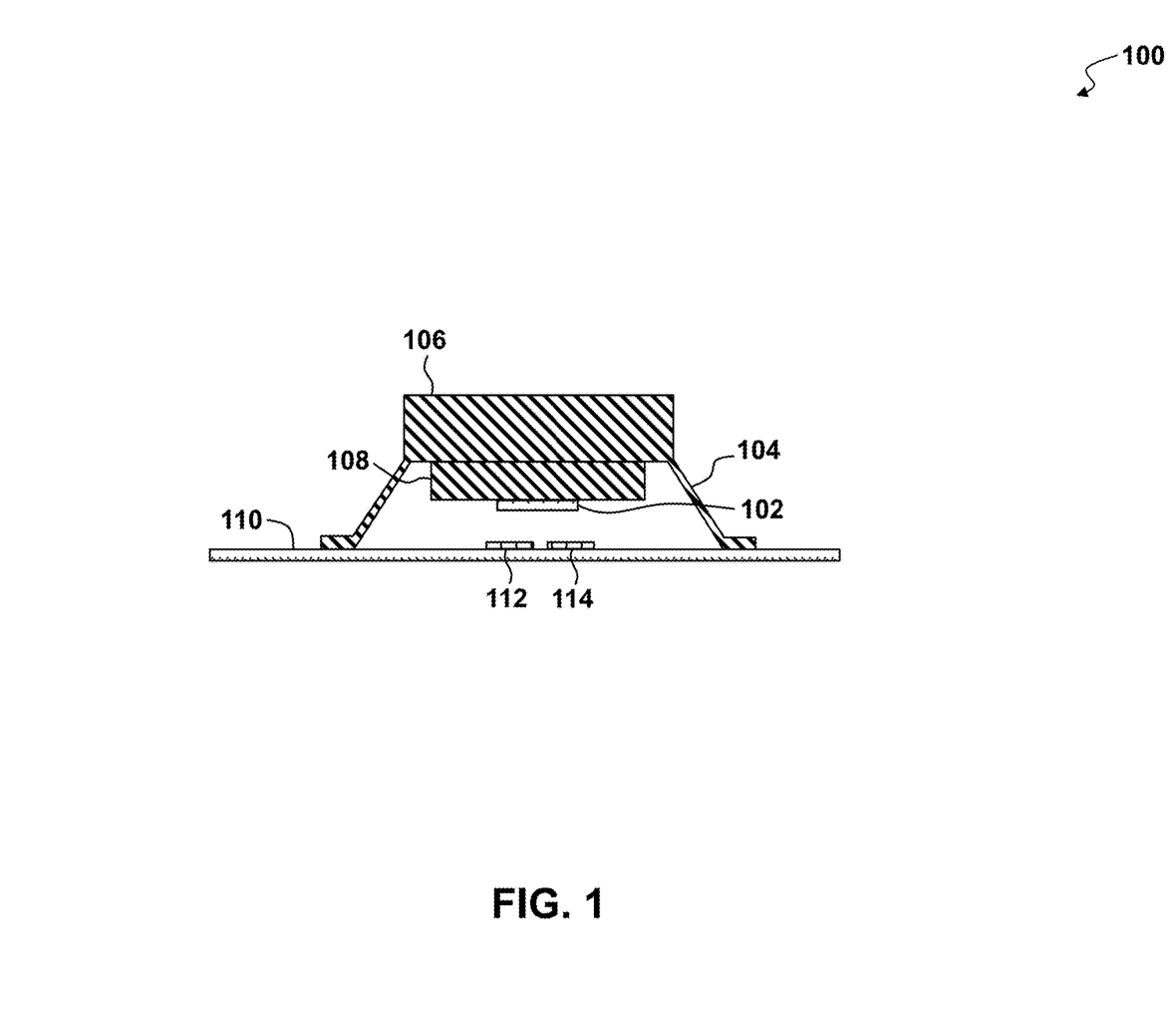
FIG. 1 depicts an exemplary cross-sectional view of a keypad having a conductive pill, disclosed herein.

Referring to FIG. 1, embodiments of an electrical switch comprising a keypad 100, are disclosed herein. FIG. 1 depicts an exemplary schematic view of the keypad 100 comprising a pushbutton 106 including a contact element 102, disclosed herein. The keypad 100 may comprise a silicon rubber keypad. The keypad 100 further comprises angled webbing 104 around a switch center for the pushbutton 106. For switch actuation, upon depression of the pushbutton 106, the webbing 104 uniformly deforms to produce a tactile response. When pressure is removed from the pushbutton 106, the webbing 104 returns to its neutral position.

In one embodiment, the contact element 102 comprises an electrically conductive layer (e.g., conductive pill 102) placed on a substrate 108 at a base of the pushbutton 106. The contact element 102 may intermittently make contact onto a printed circuit board (PCB) 110 when the webbing 104 has been deformed by depressing the pushbutton 106. The conductive pill 102 provides electrical connectivity between conductive PCB contacts 112, 114. In one embodiment, the conductive pill may have a thickness of about 0.020 inches. In one example, the conductive pill 102 may have a voltage limit of 5 volts (V) and current 10 milliamps (mA). In one embodiment, the conductive pill 102 provides reduced electrical resistance (e.g., about 0.4 ohms-0.5 ohms) through the conductive pill 102 between the PCB contacts 112, 114.

Figure 2A:
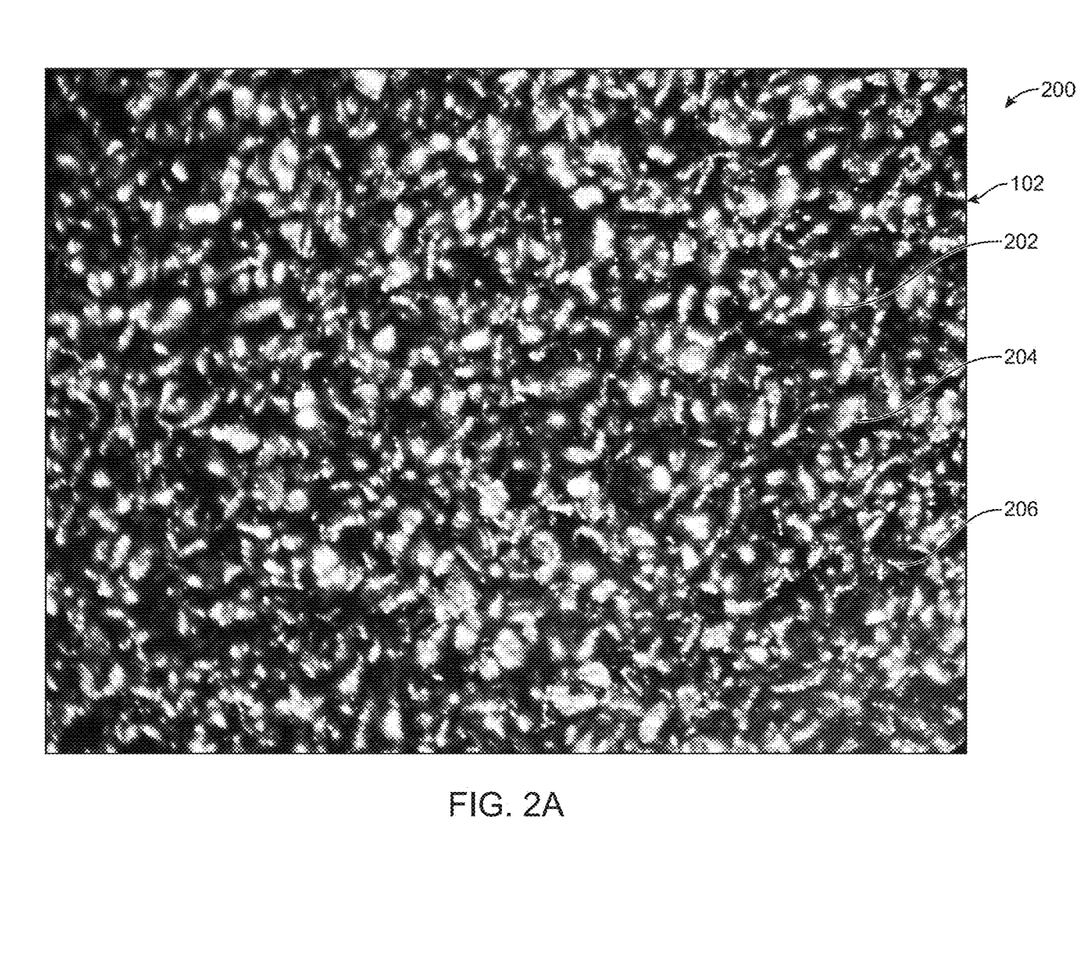
FIG. 2A depicts an enlarged view of a contact surface of an exemplary conductive pill, disclosed herein.

FIG. 2A depicts an enlarged view of a contact surface 200 of said conductive layer of an exemplary conductive pill 102, disclosed herein. In one embodiment, said conductive layer comprises irregular shaped electrically conductive particle materials 202, 204, 206 on a silicon pushbutton 106.

In one embodiment, at least a plurality of the irregularly shaped particles are discrete (individually separate and distinct), and each irregularly shaped particle in a set of said plurality of irregularly shaped particles has one or more points of contact with (is touching) one or more other surrounding irregularly shaped particles. In another embodiment, each irregularly shaped particle in a set of said irregularly shaped particles has a plurality of (e.g., two or more) points of contact with one or more other surrounding irregularly shaped particles. Further, physical contact between the irregularly shaped particles can be made/re-moved by flexing of the substrate to which the electrically conductive particles are coupled (e.g., when the switch is activated/deactivated).

Said points of contact allow the conductive layer to provide one or more electrical paths, through a plurality of irregularly shaped particles in the conductive layer that are in physical contact between the PCB contacts when the pushbutton is pressed to place the conductive pill across the PCB contacts. This allows better and more complete current flow between the PCB contacts. The irregularly shaped particles may be formed and bonded onto a silicon layer that is then bonded onto a silicon keypad (e.g., on a substrate 108 at the base of the pushbutton 106).

Figure 2B:
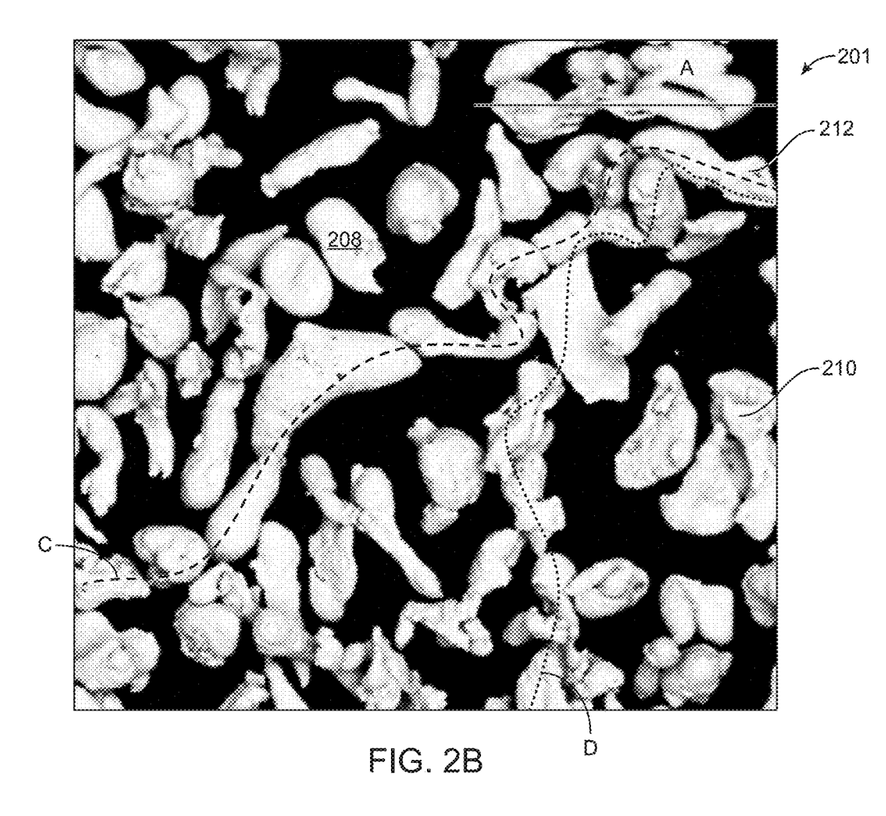
FIG. 2B depicts an enlarged view of exemplary irregularly shaped particles, disclosed herein.

FIG. 2B depicts an enlarged view 201 of exemplary irregularly shaped particles such as particles 208, 210, 212, disclosed herein. A scale for the irregularly shaped particles is depicted as reference character A having a range of, for example, 600-800 μm, and preferably 700 μm. The irregularly shaped particles may be formed from aluminum having an aluminum metal weight percentage of e.g., about 20%. FIG. 2B shows example electrical paths C and D depicted by dashed lines established through touching irregularly shaped particles. In an embodiment, when the pushbutton is not depressed, a plurality of the irregularly shaped particles in the contact pill may be fused together, however majority of the of the irregularly shaped particles are discrete and are in contact with one or more neighboring irregularly shaped particles, while other irregularly shaped particles are not in contact with other irregularly shaped particles.

In one embodiment, the average size of the irregularly shaped particles may be e.g., about 100 microns having a Scott Apparent Density of 22 $g/in^3$ (grams per cubic inch) and 1.35 g/cc (grams per cubic centimeter). The average size of the irregularly shaped particles may also be 45 microns having a Scott Apparent Density of 20 $g/in^3$ and 1.20 g/cc. These irregularly shaped particles have a low density with high conductivity, a low galvanic corrosion in contact with aluminum.

In one embodiment, the particles have an elongated shape, which creates more conductive composites. The shape of the irregularly shaped particles allows for better conductivity with less filler content in the conductive layer.

Figure 3:
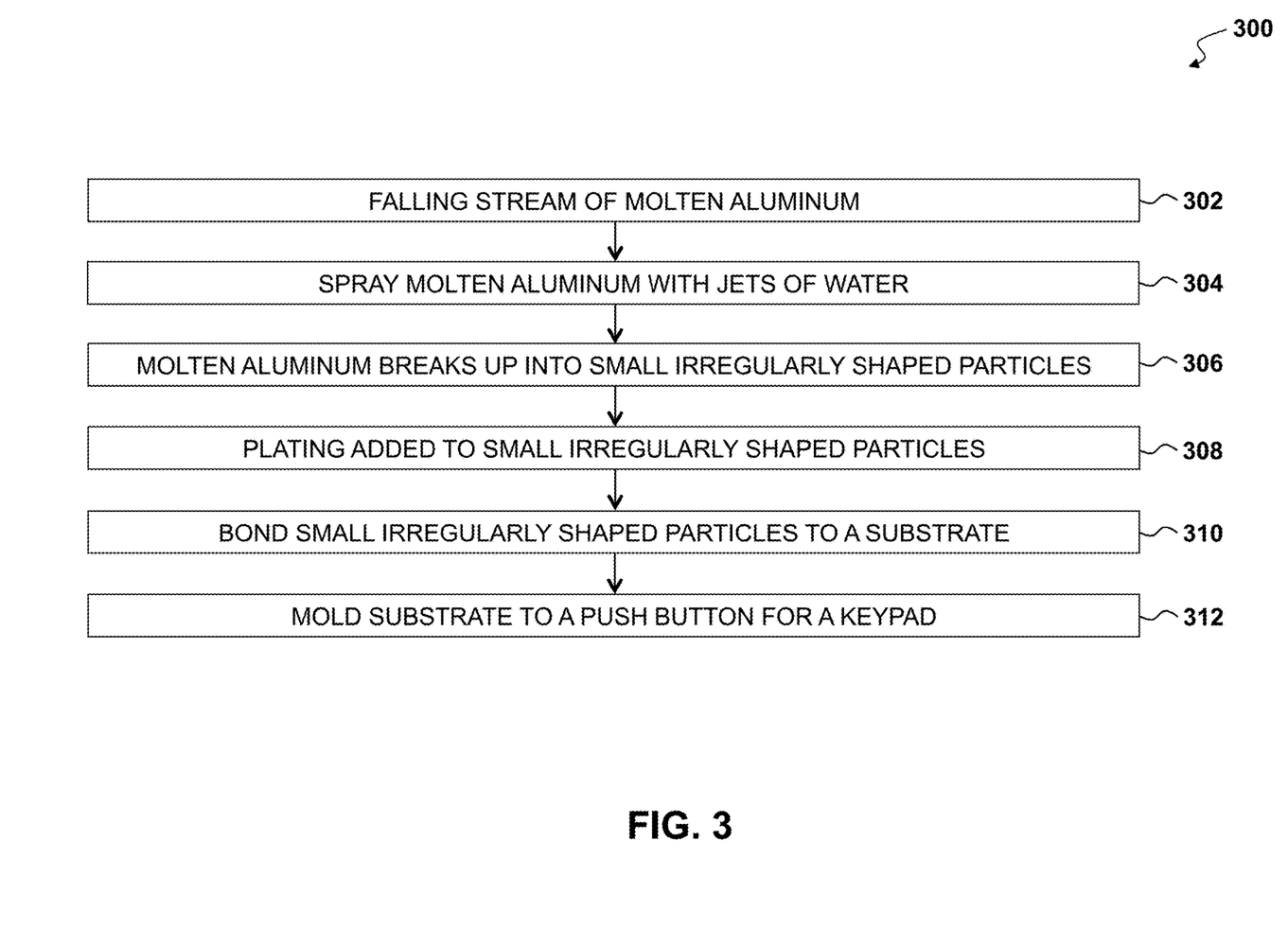
FIG. 3 depicts a flowchart of an exemplary method for forming the exemplary conductive pill, disclosed herein.

FIG. 3 depicts a flowchart 300 of an exemplary method for forming an exemplary conductive layer (conductive pill), disclosed herein. In one embodiment, the irregularly shaped conductive particle materials comprise irregular shaped aluminum particles formed by water atomization. Molten aluminum may be presented in a falling stream (step 302). The falling stream of molten aluminum may be sprayed by jets of water (step 304). The jets of water break up the molten aluminum into small irregularly shaped particles (step 306). A plating (e.g., a silver coating/plating such as a twenty-percent plating) may be added to the irregularly shaped aluminum particles (step 308).

As disclosed herein, irregularly shaped electrically particles in the conductive layer may include particles of different forms (geometric appearance) and/or different sizes. For example, there may be particles of similar forms, but different sizes. There may be particles of similar sizes, but different forms. There may be particles of different forms and different sizes. In one preferred example, such irregularly shaped particles comprise particles with random forms and/or sizes, such as shown in the drawings herein.

In some embodiments the plating may be another metal (e.g., gold, tin, etc.) based on the desired electrical conductivity. The density of the irregularly shaped particles may be about 22.18 $g/in^3$, but may vary based on the size and shape of the irregularly shaped particles. The irregularly shaped particles may be bonded on a substrate such as substrate 108 (step 310). At least a set of the irregularly shaped particles may be in physical contact with each other as they are bonded on the substrate. The physical properties of the substrate (e.g., silicon) allows the irregularly shaped electrically conductive particles to bond to the substrate. The substrate may be in sheet form and may be cut into the desired size and shape conductive layer (e.g., square, circle, etc.) for molding onto the keypad (e.g., onto the base of the pushbutton 106).

In one embodiment, wherein the substrate is flexible/elastic (e.g., silicon substrate), when the pushbutton 106 is depressed and the conductive layer 102 makes contact with the PCB, the flexing of the substrate 108 as it makes contact with the PCB allows change e.g. in orientation (or shifting) of one or more irregularly shaped particles, enabling contact with one or more other irregularly shaped particles in the conductive layer, thereby creating additional electrically conductive paths via the touching irregularly shaped particles in the conductive layer 102, between the PCB contacts (e.g., electrically conductive traces on the PCB).

The substrate may be molded (e.g., via heat applied to the silicon) onto a silicon pushbutton for a keypad (step 312). In some embodiments, other metals (e.g., silver, gold, brass, copper, etc.) may be used as conductors to create the irregularly shaped particles. Other liquids (e.g., water) may be used to spray the molten metals to create the irregularly shaped particles.

Figure 4A:
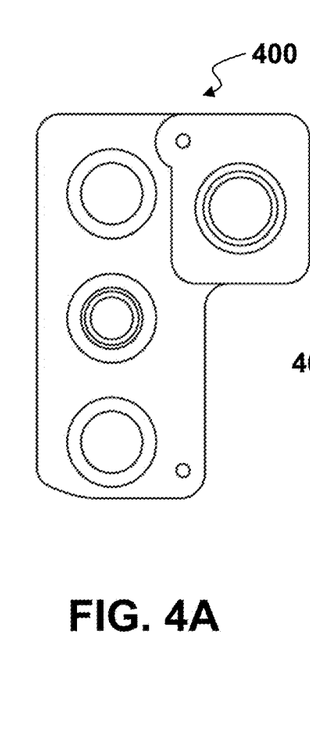
FIGS. 4A-4I depict front, front perspective, rear perspective, rear, front, and cross-sectional views, respectively, of an exemplary switch system of keypads each having a conductive pill with electrically conductive irregularly shaped particles, disclosed herein.
Figure 4B:
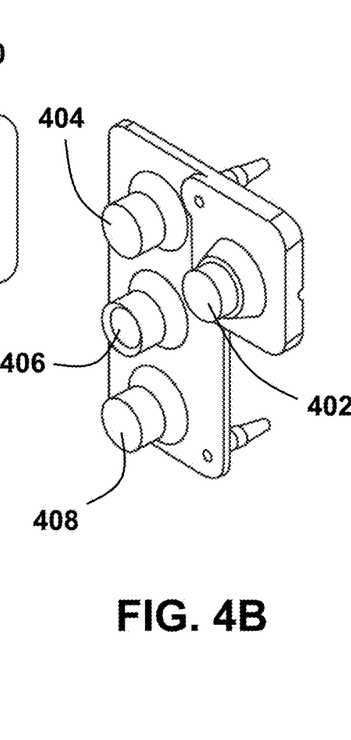
Figure 4C:
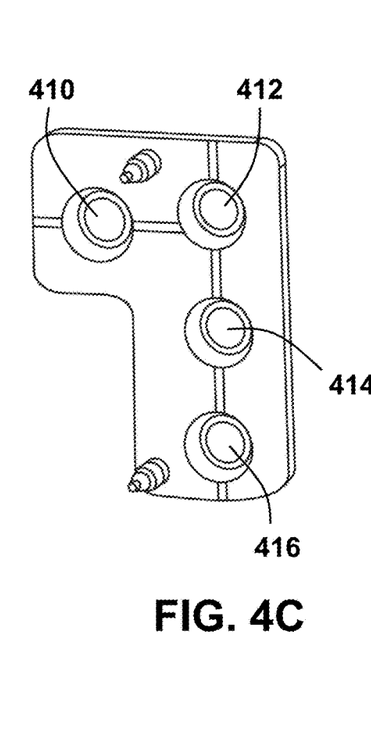
Figure 4D:
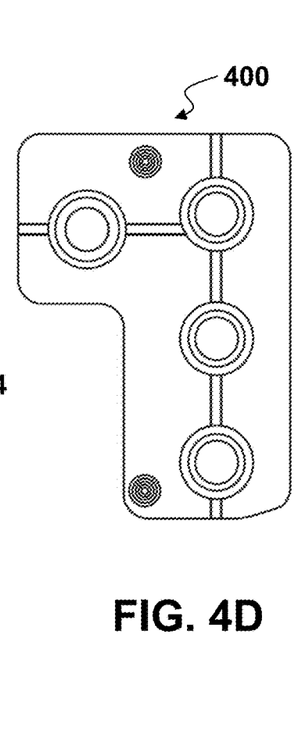
Figure 4E:
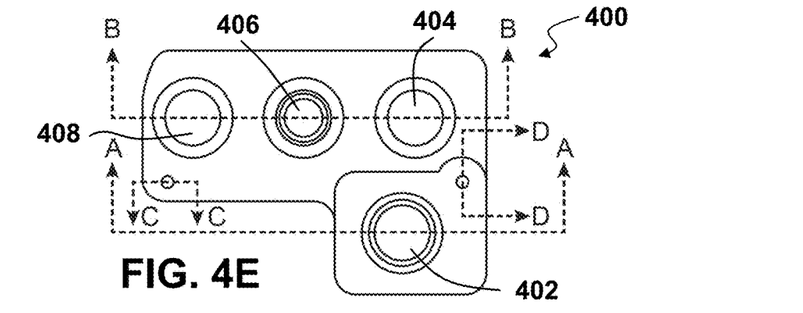
Figure 4F:
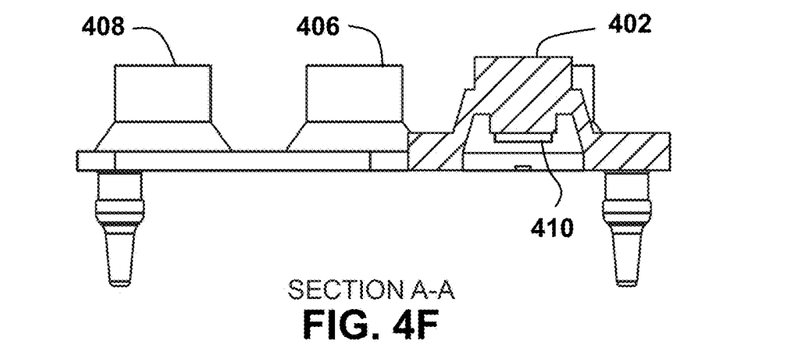
Figure 4G:
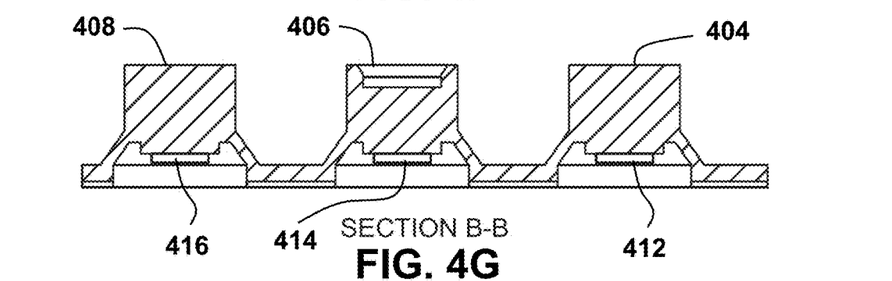
Figure 4H:
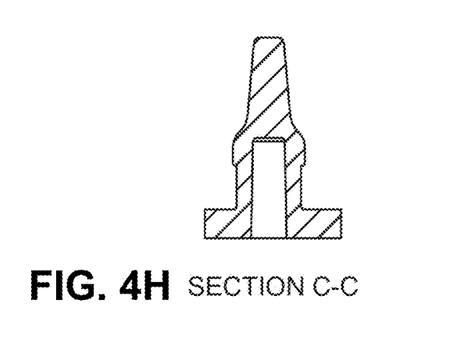
Figure 4I:
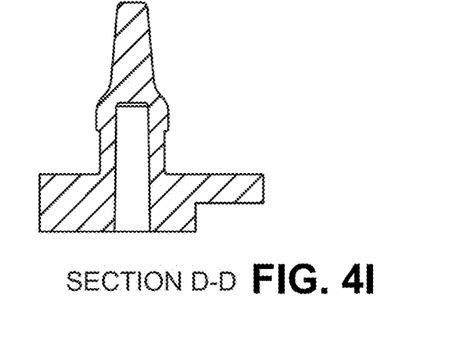

FIGS. 4A-4I depict front, front perspective, rear perspective, rear, front, and cross-sectional views, respectively, of an exemplary keypad 400 including the conductive layer (conductive pill) with irregularly shaped particles thereon, disclosed herein. FIG. 4E depicts a front view of the exemplary keypad 400 having cross-sectional views at lines A-A, B-B, C-C, and D-D shown in FIGS. 4F, 4G, 4H, and 4I, respectively.

The keypad 400 according to embodiment disclosed herein, may be disposed over a PCB having plural PCB contacts/traces corresponding to each respective conductive pill. The keypad material may be silicon having a natural and/or translucent white color. The surface of the keypad may have no dimples, silicone or debris on conductive pill or dome surfaces. In this example, the keypad has four domes (e.g., pushbuttons 402, 404, 406, 408) arranged in an L-shape, each having corresponding conductive layers with irregularly shaped particles (e.g., conductive pills 410, 412, 414, 416) for electrically connecting respective PCB contacts on a PCB when the dome is depressed. Additional embodiments may have a varying number, size, and/or arrangement of domes. The geometry of the domes 402, 404, 406, 408 may vary based on force and travel requirements of the domes for making/breaking electrical contact with the PCB contacts via the conductive layers with irregularly shaped particles thereon.

In one implementation, the first dome 402 may have a first silver/aluminum conductive pill 410 (including a conductive layer with irregularly shaped conductive particles disclosed herein) having less than 1 Ohm of electrical resistance when the conductive pill 412 provides one or more electrically conductive paths between the PCB traces. The first conductive pill 410 material may be silver/aluminum filled silicon rubber having a volume resistivity of 0.003 Ohm-cm. The first dome 402 may also have a peak resistive force of 6-9 Newton (N), after compressing five times. The travel to actuation of the first dome 402 may be 2 millimeters (mm) +/−0.3 mm. The first dome 402 may have a 50% snap ratio and a 120 thousand (120K) lifecycle minimum.

The second dome 404 may have a second silver/aluminum conductive pill 412 (including a conductive layer with irregularly shaped conductive particles disclosed herein) offering less than 1 Ohm of electrical resistance when the conductive pill 412 provides one or more electrically conductive paths between the PCB traces. The conductive pill material may be silver/aluminum filled silicon rubber having a volume resistivity of 0.003 Ohm-cm. The second dome 404 may also have a peak force of 4 N +/−1 N, after compressing five times. The travel to actuation of the second dome 402 may be 1.5 mm +0.15/−0.25 mm. The first dome 402 may have a 50% snap ratio-minimum and a 120K lifecycle minimum.

Generally, in electrical switches, due to the mass of the moving pushbutton contact and any elasticity inherent in the mechanism and/or contact materials in the switch, contacts will "bounce" upon closure for a period of milliseconds before coming to a full rest and providing unbroken contact. This causes electrical (e.g., voltage) bounce. The conductive pill disclosed herein reduces contact bounce in the signal to undetectable, or minimal level undetectable) when the conductive pill makes and breaks contact with the PCB contacts during intermittent contacting, allowing the circuit to open or close more rapidly. The irregular shape of the irregularly shaped particles creates more solid physical connections between the irregular shaped particles with larger contact points in order to reduce contact bounce. In one embodiment, the conductive pill allows the PCB circuit to close in under about 10 ms (i.e., contact bounce is reduced to under 10 ms, whereas a conventional switch with a typical contact pill can exhibit constant bounce for 10 ms, as illustrated below).

Figure 5A:
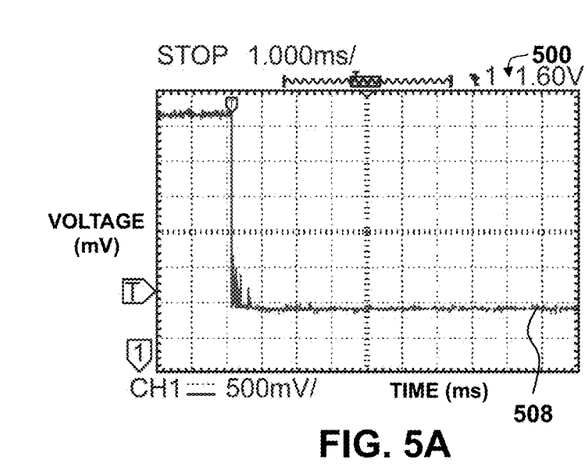
FIGS. 5A-5B depict scopes of electrical characteristics of a keypad having a standard conductive pill, showing electrical contact bounce.
Figure 5B:
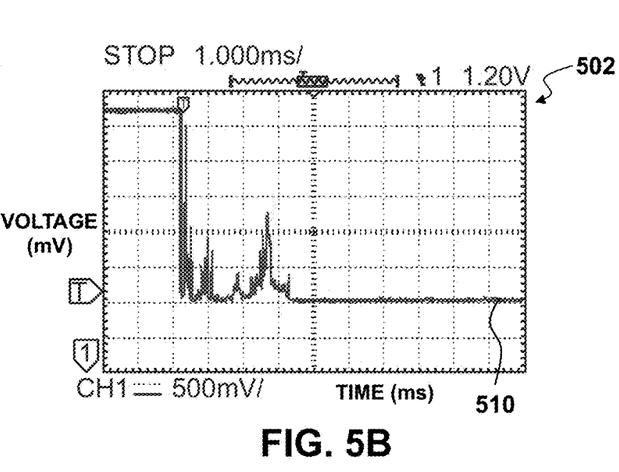

FIGS. 5A-5B depict electrical scope outputs 500, 502 of electrical characteristics of a keypad having a conventional conductive pill within an actuation lifecycle and at a limit of the actuation lifecycle, respectively, showing significant and long duration electrical contact bounce when an example conventional contact pill makes/breaks contact with PCB traces.

In FIG. 5A, a standard conductive pill within the actuation lifecycle is actuated to lower the voltage. The keypad undergoes contact bounce for approximately 10 ms, as indicated by the graph 508 on the scope 500. In FIG. 5B, the same standard conductive pill as in FIG. 5A at the limit of the actuation lifecycle is actuated to lower the voltage. The keypad undergoes significantly greater contact bounce lasting for approximately 30 ms, as shown in the graph 510 on the scope 502. The magnitude and duration of such contact bounce pose significant in electrical circuits that are connected to such conventional switches. The Cartesian axis on the scope output reflect voltage (e.g., mV) on the vertical axis vs time (e.g., msec) on the horizontal axis.

Figure 5C:
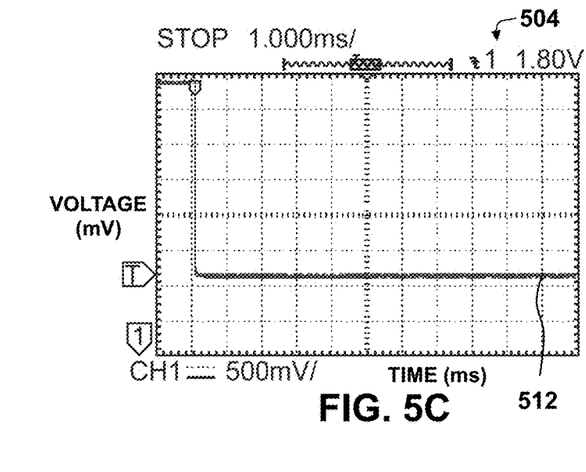
FIGS. 5C-5D depict scopes of electrical characteristics of a keypad having the irregularly shaped conductive particles in an electrically conductive layer disclosed herein within an actuation lifecycle and at a limit of the actuation lifecycle, respectively, showing reduced electrical contact bounce.
Figure 5D:
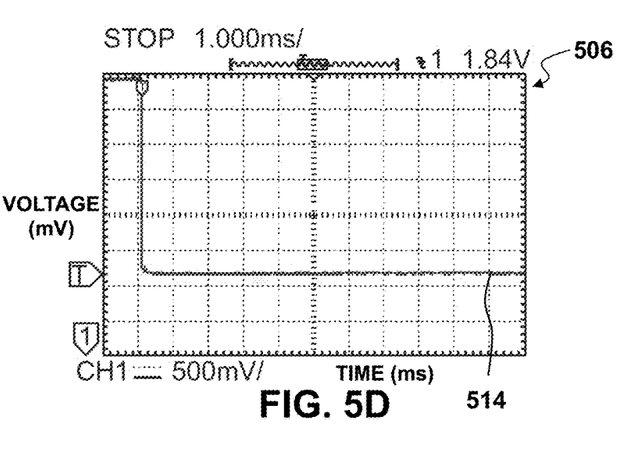

FIGS. 5C-5D depict scope outputs 504, 506 of electrical characteristics of a keypad having the irregularly shaped particles disclosed herein within an actuation lifecycle and at a limit of the actuation lifecycle, respectively, showing a lack of electrical contact bounce. The scope outputs each show electrical signal characteristics of a switch closing when the conductive layer of the keypad including irregularly shaped electrically conductive particles disclosed herein, makes (breaks) contact with PCB contacts such that voltage between the PCB contacts drops from 3V to 2.5V as current flows through the conductive layer between the PCB contacts (e.g., causing a voltage/current change in a connected electrical circuits monitored by the electrical scope).

The Cartesian axis on the scope output reflect voltage (e.g., mV) on the vertical axis vs time (e.g., msec) on the horizontal axis.

In FIG. 5C, the conductive pill having irregularly shaped particles disclosed herein, and within the actuation lifecycle, is actuated to lower the voltage. The keypad has reduced (e.g., minimal) electrical contact bounce, as indicated by the graph 512 on the scope 504. In FIG. 5D, the same disclosed conductive pill as in FIG. 5C at the limit of the actuation lifecycle is actuated to lower the voltage. The keypad has reduced (e.g., minimal) electrical contact bounce, as shown by the graph 514 on the scope 506. An unexpected result of utilizing the irregularly shaped particles as material for a contact pill in a keypad is that contact bounce is reduced and/or eliminated. Further, this reduction and/or elimination of contact bounce is retained throughout the lifetime of the keypad, as compared to standard keypads in which the contact bounce becomes increasingly worse over the lifetime of the keypad. This surprising and unexpected result is not shown in the prior art keypads nor the prior art contact pills.

In one embodiment, the electrically conductive contact layer/element disclosed herein (e.g., conductive pills 102, 410, 412, 414, 416) comprises discrete irregularly shaped electrically conductive particles disposed on (e.g., bonded to) a silicon substrate, which maintains physical contact between at least a plurality of the discrete irregularly shaped electrically conductive particles thereon. In one embodiment, the keypad is not flexible (e.g., at least the substrate 108 is not elastic, the pushbutton substrate 106 is not elastic, the webbing 104 comprises a metal spring, etc), wherein the conductive layer 102 is coupled to the substrate 108.

The flowchart and block diagrams in the Figures illustrate the architecture, functionality, and operation of possible implementations of systems and methods according to various embodiments. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the embodiments. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the embodiments has been presented for purposes of illustration and description, but is not intended to be exhaustive or limited to the embodiments in the form disclosed. Many modifications and variations will be apparent to those of ordinary skill in the art without departing from the scope and spirit of the embodiments. The examples disclosed were chosen and described in order to best explain the principles of the embodiments and the practical application, and to enable others of ordinary skill in the art to understand the various embodiments with various modifications as are suited to the particular use contemplated.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A keypad comprising a pushbutton including a contact element for intermittent contacting of printed circuit board (PCB) contacts on a PCB, wherein the contact element comprises a plurality of discrete irregularly shaped electrically conductive particles, wherein contact between at least a portion of the plurality of irregularly shaped particles provides a plurality of electrical paths, and wherein the contact element is coupled to the pushbutton.

2. The flexible keypad of claim 1, wherein the density of the plurality of irregularly shaped particles is 22.18 g/in$^3$.

3. The flexible keypad of claim 1, wherein the material of the plurality of irregularly shaped particles is silver.

4. The flexible keypad of claim 1, wherein the contact element is bonded to a silicon substrate.

5. The flexible keypad of claim 1, wherein contact bounce between the contact element and the PCB contacts during intermittent contacting is at a minimal level.

6. The flexible keypad of claim 1, wherein the material of the plurality of irregularly shaped particles is aluminum.

7. The flexible keypad of claim 6, wherein the contact element further comprises a plating.

8. The flexible keypad of claim 7, wherein the material of the plating is one or more of: silver, gold, and tin.

9. The flexible keypad of claim 1, wherein the material of the plurality of irregularly shaped particles is one or more of: gold, brass, and copper.

10. The flexible keypad of claim 9, wherein the material of the keypad is silicon.

11. The flexible keypad of claim 1, wherein each irregularly shaped particle in a portion of the plurality of irregularly shaped particles has a plurality of points of contact with one or more other irregularly shaped particles of the portion of the plurality of irregularly shaped particles.

12. The flexible keypad of claim 11, wherein the plurality of points of contact is increased during contact of the contact element across the PCB contacts via compression of the contact element.

13. The flexible keypad of claim 11, wherein the contact element is more conductive during contact of the contact element across the PCB contacts via compression of the contact element.

14. The flexible keypad of claim 11, wherein a circuit comprising the PCB contacts is closed within 10 ms of contact between the contact element and the PCB contacts.

15. The flexible keypad of claim 11, wherein each irregularly shaped particle of the plurality of irregularly shaped particles is discrete.

16. An electrical system comprising:
a printed circuit board (PCB) including a plurality of electrical traces; and
a pushbutton disposed on the PCB, the pushbutton comprising:
a substrate; and
a contact element disposed on the substrate, the contact element comprising a plurality of discrete irregularly shaped electrically conductive particles, wherein contact between at least a portion of the plurality of discrete irregularly shaped electrically conductive particles provides a plurality of electrical paths;
wherein a depression of the pushbutton causes contact of the contact element with the plurality of electrical traces on the PCB; and
wherein contact bounce between the contact element and the PCB contacts during intermittent contacting is less than 10 ms.

17. The electrical system of claim 16 wherein contact of the contact element with the plurality of electrical traces on the PCB causes a change in orientation of one or more of the plurality of discrete irregularly shaped electrically conductive particles to create additional electrically conductive paths of the plurality of electrical paths through the contact element between the plurality of electrical traces of the PCB.

18. The electrical system of claim 16 wherein each discrete irregularly shaped electrically conductive particle in a portion of the plurality of discrete irregularly shaped electrically conductive particles has a plurality of points of contact with one or more other discrete irregularly shaped electrically conductive particles of the portion of the plurality of discrete irregularly shaped electrically conductive particles.

19. The electrical system of claim 16 wherein contact between at least a portion of the plurality of discrete irregularly shaped electrically conductive particles provides a plurality of electrical paths when the contact element is spaced from the PCB.

20. The electrical system of claim 19 wherein the plurality of electrical paths is increased during contact of the contact element with the plurality of electrical traces on the PCB.

* * * * *